(12) United States Patent
Lee et al.

(10) Patent No.: US 8,268,711 B2
(45) Date of Patent: Sep. 18, 2012

(54) FLOATING GATE HAVING MULTIPLE CHARGE STORING LAYERS, METHOD OF FABRICATING THE FLOATING GATE, NON-VOLATILE MEMORY DEVICE USING THE SAME, AND FABRICATING METHOD THEREOF

(75) Inventors: Jang-Sik Lee, Seoul (KR); Jinhan Cho, Seoul (KR); Jaegab Lee, Seoul (KR)

(73) Assignee: Kookmin University Industry Academy Cooperation Foundation, Seoul (KR)

( * ) Notice: Subject to any disclaimer, the term of this patent is extended or adjusted under 35 U.S.C. 154(b) by 118 days.

(21) Appl. No.: 12/791,253

(22) Filed: Jun. 1, 2010

(65) Prior Publication Data

US 2010/0240208 A1    Sep. 23, 2010

Related U.S. Application Data

(62) Division of application No. 11/907,639, filed on Oct. 16, 2007, now Pat. No. 7,745,874.

(30) Foreign Application Priority Data

Sep. 27, 2007  (KR) .................. 10-2007-0097519

(51) Int. Cl.
*H01L 21/3205*  (2006.01)

(52) U.S. Cl. .................. 438/591; 438/257; 438/763
(58) Field of Classification Search .................. 438/257, 438/591, 763
See application file for complete search history.

(56) References Cited

U.S. PATENT DOCUMENTS

| 5,403,680 A * | 4/1995 | Otagawa et al. .............. 429/213 |
| 6,444,545 B1 | 9/2002 | Sadd et al. |
| 2007/0102750 A1 * | 5/2007 | Kim et al. ..................... 257/314 |

* cited by examiner

*Primary Examiner* — Long Pham
(74) *Attorney, Agent, or Firm* — Rosenberg, Klein & Lee

(57) ABSTRACT

Provided is a floating gate having multiple charge storage layers, a non-volatile memory device using the same, and a method of fabricating the floating gate and the non-volatile memory device, in which the multiple charge storage layers using metallic/semiconducting nano-particles is formed to thereby enhance a charge storage capacity of the memory device. The floating gate includes a polymer electrolytic film which is deposited on a tunneling oxide film, and is formed of at least one stage in which at least one thin film is deposited on each stage, and at least one metal nano-particle layer which is self-assembled on the upper surface of each stage of the polymer electrolytic film and on which a number of nano-particles for trapping charges are formed. The floating gate is made by self-assembling the nano-particles on the polymer electrolytic film, and thus can be fabricated without undergoing a heat treatment process at high temperature.

11 Claims, 8 Drawing Sheets

FLOATING GATE HAVING MULTIPLE CHARGE STORING LAYERS, METHOD OF FABRICATING THE FLOATING GATE, NON-VOLATILE MEMORY DEVICE USING THE SAME, AND FABRICATING METHOD THEREOF

RELATED APPLICATIONS

This application is a Divisional patent application of co-pending application Ser. No. 11/907,639, filed on 16 Oct. 2007. The entire disclosure of the prior application Ser. No. 11/907,639, from which an oath or declaration is supplied, is considered a part of the disclosure of the accompanying Divisional application and is hereby incorporated by reference.

BACKGROUND OF THE INVENTION

1. Field of the Invention

The present invention relates to a floating gate having multiple charge storing layers, a method of fabricating the floating gate, a non-volatile memory device using the same, and a method of fabricating the non-volatile memory device, and more particularly, to a floating gate having multiple charge storing layers, a method of fabricating the floating gate, a non-volatile memory device using the same, and a method of fabricating the non-volatile memory device, in which the multiple charge storing layers which use metal nano-crystals of nano size which can easily adjust density and size, is formed to thereby enhance a charge storage capacity of the memory device.

2. Description of the Related Art

A flash memory device which is one of non-volatile memory devices can be largely classified into a floating gate type flash memory device and SONOS (Silicon-Oxide-Nitride-Oxide-Semiconductor) type flash memory device according to a charge storing structure.

The SONOS type flash memory device includes a source electrode and a drain electrode which are formed in a silicon substrate, a tunneling oxide film which is deposited on the upper surface of the silicon substrate, a nitride film which is deposited on the upper surface of the tunneling oxide film, an interception oxide film which is formed on the upper surface of the nitride film, and a gate electrode which is formed on the upper surface of the interception oxide film, in which the tunneling oxide film, the nitride film, and the interception oxide film generally have an ONO (Oxide/Nitride/Oxide) structure.

The SONOS type flash memory device can function as a memory device that stores information in which electrons are captured in charge defects formed in the inside of the nitride film formed on the upper surface of the tunneling oxide film. However, it is hard to adjust or control the number of the charge defects of the inside of the nitride film to capture electrons.

The floating gate type flash memory device generally has a vertical deposition style multi-layer gate structure having a floating gate on a silicon substrate, and the multi-layer gate structure includes at least one tunneling oxide film or dielectric film, a floating gate formed on the tunneling oxide film, and a control gate formed on the floating gate.

The floating gate type flash memory device applies a proper voltage to the control gate and the substrate, to thus make charges flow in/drain from the floating gate and to thereby record/delete data. The dielectric film maintains the charges charged in the floating gate.

By the way, if a defect or defects occur in the tunneling oxide film which have been formed below the floating gate, all charges stored in the floating gate may be lost.

Also, in the case of the flash memory cell of the deposition style gate structure, the tunneling oxide film through which charges pass has a high energy barrier in the band diagram. For this reason, a tunneling probability of charges reduces in the geometric series if thickness of the tunneling oxide film does not reduce. Therefore, the tunneling oxide film should be formed with a very precise and thin thickness. However, because it is not easy to form the tunneling oxide film very thinly without having defects, charge loss due to defects of the tunneling oxide film may occur more frequently.

Recently, to overcome problems of non-volatile memory devices that have floating gate electrodes as described above, the floating gate electrodes made of polysilicon is not used as a unit for storing charges but methods that use nano-crystals are under study.

In the case of the non-volatile memory device that uses nano-crystals as a trap film, charges are dispersed over and trapped in many nano-crystals. Thus, even though several bad crystals occur, storing of charges is not influenced seriously. Therefore, leakage current of charges reduces in comparison with the non-volatile memory devices using the floating gate electrodes, and accordingly a data retention feature can be secured sufficiently.

An example of methods of forming a modified SONOS type non-volatile memory device by forming silicon nano-crystals using a silicon-rich silicon nitride film is disclosed in U.S. Pat. No. 6,444,545.

By the way, in the case of the non-volatile memory device including nano-crystals, it is not easy to form many nano-crystals in a confined area. Accordingly, it is hard to secure a sufficient trap site. Therefore, since there is not a big difference between a threshold voltage when programmed and a threshold voltage when erased, it is not easy to identify data which is stored in a cell transistor of the non-volatile memory device. As a result, poor operations may easily occur.

Also, in the case that metal nano-crystals are used as a charge trap layer, metal is apt to be spread to a lower tunneling oxide film during a process in progress. In this case, since the tunneling oxide film is polluted by metal, a problem that a reliability drops may occur.

In order to solve the problem, the Korean Patent No. 745400 discloses a charge trap structure including a first charge trap layer made of silicon nitride and a second charge trap layer made of silicon nano-crystals or metal nano-crystals, for preventing metallic diffusion between a tunneling oxide film and a dielectric film.

However, the metal nano-crystals are formed by depositing and then heat-treating tungsten nitride, using a LPCVD (Low Pressure Chemical Vapor Deposition) process or UHCVD (Ultra High vacuum CVD) process. The silicon nano-crystals are formed using Si-rich oxide, Si-rich nitride, and Si-rich oxinitride, That is, the silicon nano-crystals are formed by the processes of forming silicon-rich oxide film, and heat-treating the same, in which excessive silicons which are not combined with oxygen in the silicon oxide film cohere.

Therefore, in the Korean Patent No. 745400, a high temperature heat treatment process is needed to form the nano-crystals on the first charge trap made of the silicon nitride.

However, when a high temperature heat treatment process proceeds to form nano-crystals in a silicon substrate, a film quality characteristic of each component (for example, a tunneling oxide film) may change according to an interface reaction and defect. Problems such as components of various film qualities and unnecessary diffusion of ions due to an ion implantation process occur, to thus deteriorate characteristics of the components.

Therefore, a technology of manufacturing a floating gate type flash memory device that can prevent problems which may be caused by a high temperature heat treatment process while taking the merits of nano-crystals, by using nano-crystals whose density and size can be easily controlled in a floating gate, is required. In addition, a method of increasing density of nano-crystals is required in order to improve an information storage capacity in one memory cell.

SUMMARY OF THE INVENTION

To solve the above problems of the conventional art, it is an object of the present invention to provide a floating gate having multi-layer charge storing layers, a method of fabricating the floating gate, a non-volatile memory device using the same, and a method of fabricating the non-volatile memory device, in which a positive charge and a negative charge are artificially controlled using charged polyelectrolyte, to thus laminate the polyelectrolyte and metal nano-crystals in a multi-layer in order to form a floating gate and to thus improve a charge storage capacity of the non-volatile memory device.

It is another object of the present invention to provide a non-volatile memory device using a floating gate and a method of fabricating the non-volatile memory device, in which the floating gate is formed using metal nano-crystals which are self-assembled with polyelectrolyte without undergoing a high temperature heat treatment process such as a film quality characteristic change of a gate structure.

It is still another object of the present invention to provide a non-volatile memory device and a method thereof, having an improved information storage capacity and memory characteristic in which multi-layer metal nano-crystals are used as a charge storing layer to thus remarkably increase density of the nano-crystals.

To accomplish the object of the present invention, there is provided a floating gate which is formed between a tunneling oxide film and a control oxide film in order to store charges, for use in a non-volatile memory device, the floating gate comprising: a polymer electrolytic film which is formed on the tunneling oxide film, and is formed of at least one stage in which at least one layer is deposited on each stage, the at least one layer having a charged surface; and at least one charge trap layer of metal nano-crystals which are adsorbed on the upper surface of each stage of the polymer electrolytic film.

Preferably but not necessarily, the polymer electrolytic film of each stage is formed by laminating a first electrolytic film having a positive charge and a second electrolytic film having a negative charge alternately in a multi-stage, and the metal nano-crystals are combined using any one method among an electrostatic attraction force, a hydrogen bond and a covalent bond.

Preferably but not necessarily, the tunneling oxide film and the control oxide film are made of at least one selected from the group consisting of silicon oxide ($SiO_2$), aluminum oxide ($Al_2O_3$), zirconium oxide, zirconium silicate, hafnium oxide ($HfO_2$), and hafnium silicate.

According to another aspect of the present invention, there is also provided a non-volatile memory device comprising: a substrate; a tunneling oxide film formed on the substrate; at least one polymer electrolytic film which is formed on the tunneling oxide film, and is charged; at least one charge trap layer which is made of a number of metal nano-crystals and which is adsorbed on the upper surface of the polymer electrolytic film; a control oxide film formed on the upper part of the charge trap layer; and a control gate formed on the control oxide film.

Preferably but not necessarily, the polymer electrolytic film is made of at least one layer.

Preferably but not necessarily, the polymer electrolytic film is formed of a thin film made of any one selected from the group consisting of an amine group, a sulfonic acid ($SO_3^-$) group and a carboxylic acid ($COO^-$) group.

Preferably but not necessarily, the polymer electrolytic film is formed by laminating a first electrolytic film having a positive charge and a second electrolytic film having a negative charge alternately in a multi-stage, to adsorb the metal nano-crystals by a self-assembly method.

Preferably but not necessarily, the self-assembly between the metal nano-crystals and the polymer electrolytic film is accomplished using any one among an electrostatic attraction force, a hydrogen bond and a covalent bond, and the metal nano-crystals are set to have a charge polarity reverse to that of the polymer electrolytic film which is located at the uppermost layer of the polymer electrolytic film.

Preferably but not necessarily, the at least one polymer electrolytic film and the at least one charge trap layer form a floating gate storing charges.

Preferably but not necessarily, the floating gate is formed of a structure that poly(allylamine), poly(styrenesulfonate), poly(allylamine) and a charge trap layer made of a number of gold nano-crystals having negative charge are sequentially deposited.

According to still another aspect of the present invention, there is also provided a non-volatile memory device comprising: a semiconductor substrate; a tunneling oxide film formed on the semiconductor substrate; a floating gate which is formed on the tunneling oxide film to store charges selectively; a control oxide film formed on the upper part of the charge trap layer; and a control gate formed on the control oxide film, wherein the floating gate comprises: at least one stage polymer electrolytic film which is formed on the tunneling oxide film, to adsorb and support metal nano-crystals; at least one charge trap layer which is made of a number of metal nano-crystals and which is adsorbed on the upper surface of each stage of the polymer electrolytic film.

Preferably but not necessarily, the polymer electrolytic film of each stage is formed of a structure that two polymer electrolytic films whose surface charge polarities differ from each other are deposited.

According to yet another aspect of the present invention, there is also provided a method of manufacturing a floating gate, the floating gate manufacturing method comprising the steps of: forming a tunneling oxide film on a substrate; forming a polymer electrolytic film on the tunneling oxide film; forming a metal nano-crystal film in which a number of metal nano-crystals are formed on the polymer electrolytic film; and repeatedly forming the polymer electrolytic film and the metal nano-crystal film by at least one time.

Preferably but not necessarily, the floating gate manufacturing method further comprises the step of surface-treating the surface of the tunneling oxide film to have a negative charge before having formed the polymer electrolytic film, wherein the step of forming the polymer electrolytic film comprises: a first step of forming a first electrolytic film having a positive charge on the upper portion of the tunneling oxide film having a negative charge using a self-assembly method; a second step of forming a second electrolytic film having a negative charge on the first electrolytic film using a self-assembly method; and repeating the first and second steps by at least one time.

Preferably but not necessarily, the polymer electrolytic film is formed of a thin film made of at least one selected from the group consisting of an amine group, a sulfonic acid ($SO_3^-$) and carboxylic acid ($COO^-$) group, or a multi-layer thin film made by alternatively laminating at least two selected from the group consisting of an amine group, a sulfonic acid ($SO_3^-$) and carboxylic acid ($COO^-$) group.

Preferably but not necessarily, the polymer electrolytic film is made of poly(allylamine), poly(styrenesulfonate), and poly(allylamine), and is formed by adsorption in a solution or spin coating.

Preferably but not necessarily, the step of forming the metal nano-crystals on the polymer electrolytic film comprises: preparing the solution in which a number of metal nano-crystals having a charge polarity reverse to that of the polymer electrolytic film are dispersed; and dipping the substrate in which the polymer electrolytic film is formed into the solution or spin coating to self-assemble the number of nano-crystals on the polymer electrolytic film.

Preferably but not necessarily, density of the metal nano-crystals which are self-assembled on the polymer electrolytic film is adjusted by a hydrogen ion concentration index (pH) of the solution.

Preferably but not necessarily, the metal nano-crystals are made of any one selected from the group consisting of Co, Fe, Ni, Cr, Au, Ag, Cu, Al, Pt, Sn, W, Ru, Pd and Cd.

Preferably but not necessarily, the metal nano-crystals have a size between 0.1 or 100 nm, respectively.

Preferably but not necessarily, the metal nano-crystals are combined with the polymer electrolytic film using any one among an electrostatic attraction force, a hydrogen bond and a covalent bond.

According to yet another aspect of the present invention, there is also provided a method of manufacturing a non-volatile memory device, the method comprising the steps of: forming a tunneling oxide film on a substrate; forming a polymer electrolytic film on the tunneling oxide film; forming a charge trap layer made of a number of the nano-crystals on the polymer electrolytic film; forming a control oxide film on the charge trap layer; and forming a control gate on the control oxide film.

Preferably but not necessarily, the step of forming a polymer electrolytic film and the step of forming a charge trap layer are executed by at least one time.

Preferably but not necessarily, the non-volatile memory device manufacturing method further comprises the step of surface-treating the surface of the tunneling oxide film to have a charge polarity reverse to that of the polymer electrolytic film before having formed the polymer electrolytic film, and wherein the polymer electrolytic film is formed on the upper portion of the tunneling oxide film by a self-assembly method.

Preferably but not necessarily, the step of forming the polymer electrolytic film is executed by laminating a first electrolytic film having a positive charge and a second electrolytic film having a negative charge alternately in a multi-stage, on the upper portion of the tunneling oxide film having the negative charge.

Preferably but not necessarily, the step of forming the charge trap layer is executed by self-assembling a number of metal nano-crystals on the polymer electrolytic film using a solution in which the number of metal nano-crystals having a charge polarity reverse to that of the polymer electrolytic film is dispersed.

Preferably but not necessarily, a hydrogen ion concentration index (pH) of the solution is set in the range of 3 to 10.

The floating gate may be applied to a floating electrode for use in a non-volatile memory device or a thin film transistor liquid crystal display device (TFT-LCD), and the non-volatile memory device is for example a flash memory device.

In the non-volatile memory device, a region in which the metal nano-crystals are not arranged has a Metal-Oxide-Semiconductor (MOS) structure, and a region in which the metal nano-crystals are arranged has a structure of a control metal gate-a control oxide film-a metal nano-crystal floating gate-a tunneling oxide film-a silicon semiconductor substrate.

BRIEF DESCRIPTION OF THE DRAWINGS

The above and other objects and advantages of the present invention will become more apparent by describing the preferred embodiment thereof in more detail with reference to the accompanying drawings in which.

DETAILED DESCRIPTION OF THE INVENTION

A floating gate having multiple charge storing layers, a method of fabricating the floating gate, a non-volatile memory device using the same, and a method of fabricating the non-volatile memory device, according to an exemplary embodiment of the present invention will be described below in detail with reference to the accompanying drawings.

In the following embodiments, a structure that an active region and a gate structure are formed by laminating a number of flat thin films in a non-volatile memory device will be described below as an example, but this invention can be identically applied to other non-volatile memory devices in which a gate structure, for example, an active region of the gate structure is formed of a protruded fin shape and the gate structure is formed of a curved line along the active region, in order to increase a contact area.

Figure 1:
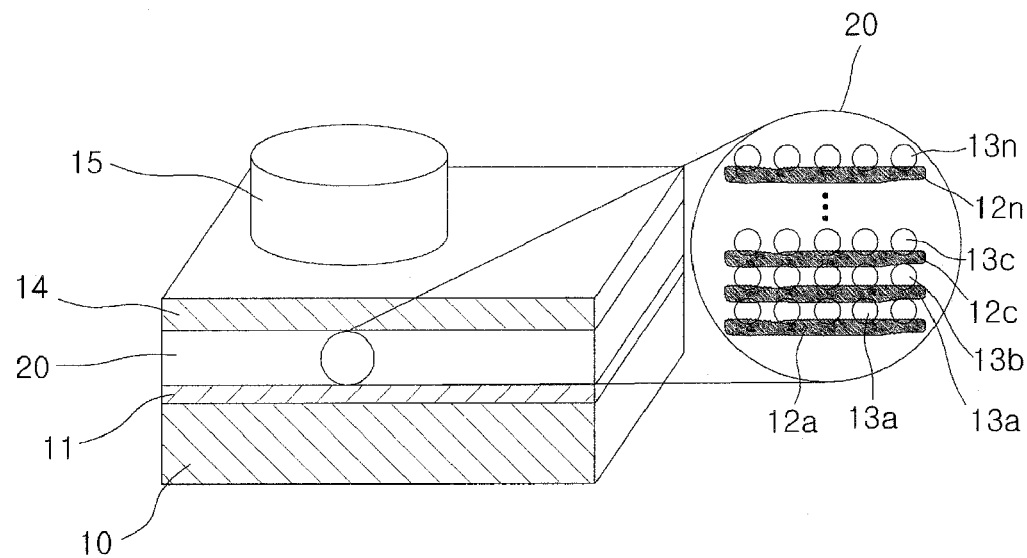
FIG. 1 is a perspective view schematically showing a non-volatile memory device having multiple charge storing layers according to an embodiment of the present invention.

FIG. 1 is a perspective view schematically showing a non-volatile memory device having multiple charge storing layers according to an embodiment of the present invention, and FIGS. 2A to 2F are cross-sectional views showing a manufacturing process of a non-volatile memory device having multiple charge storing layers according to the embodiment of the present invention.

Figure 2A:
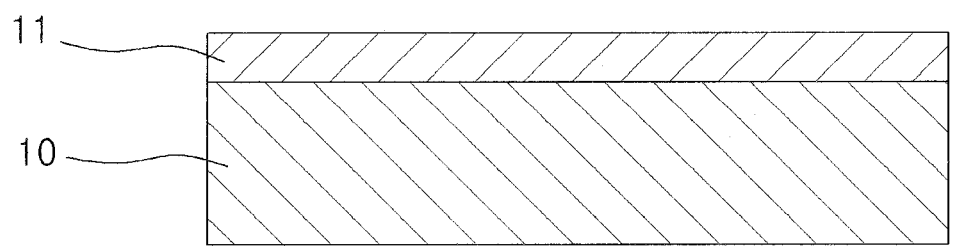
FIGS. 2A to 2F are cross-sectional views showing a manufacturing process of a non-volatile memory device having multiple charge storing layers according to the embodiment of the present invention.
Figure 2B:
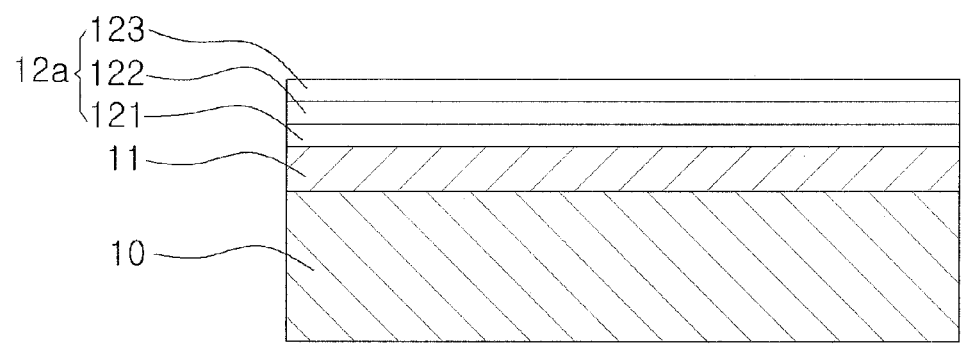
Figure 2C:
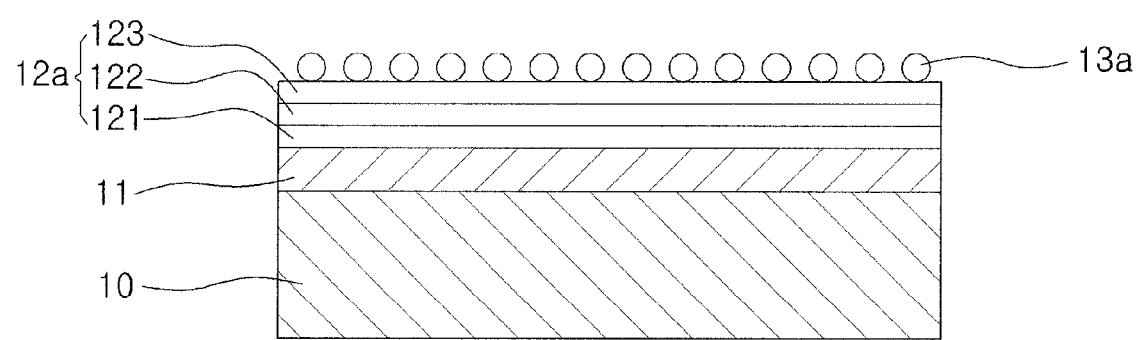
Figure 2D:
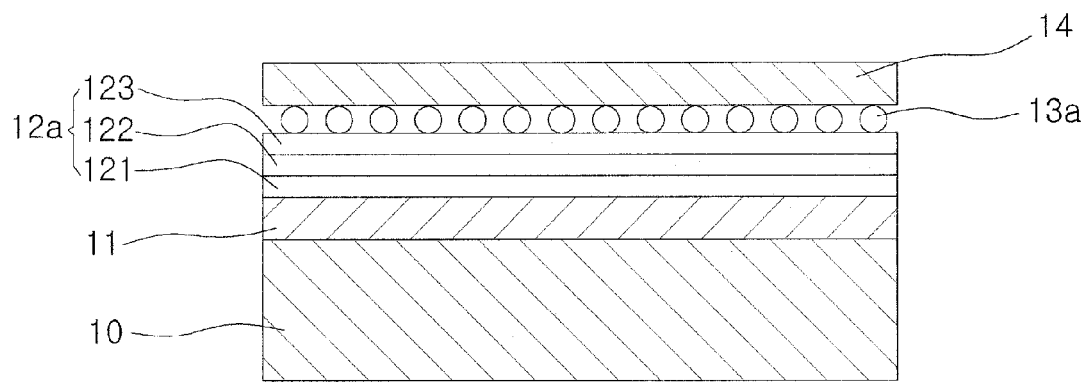
Figure 2E:
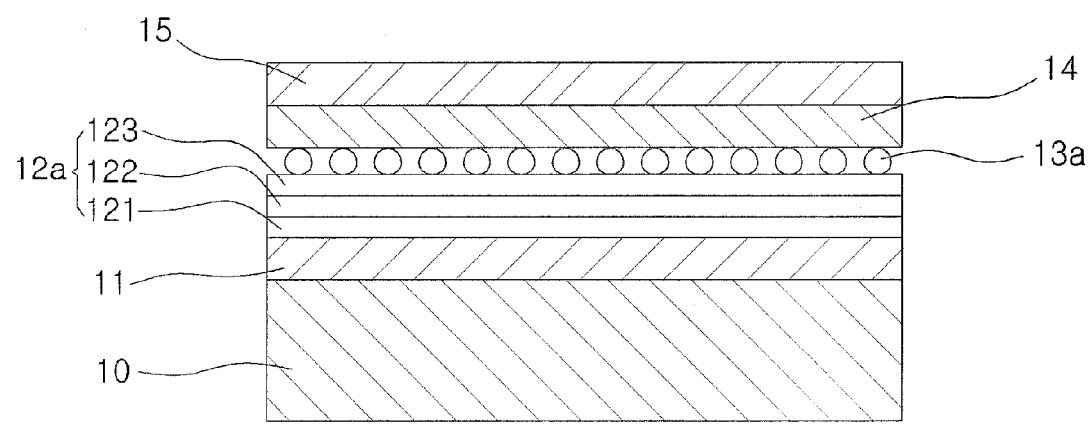
Figure 2F:
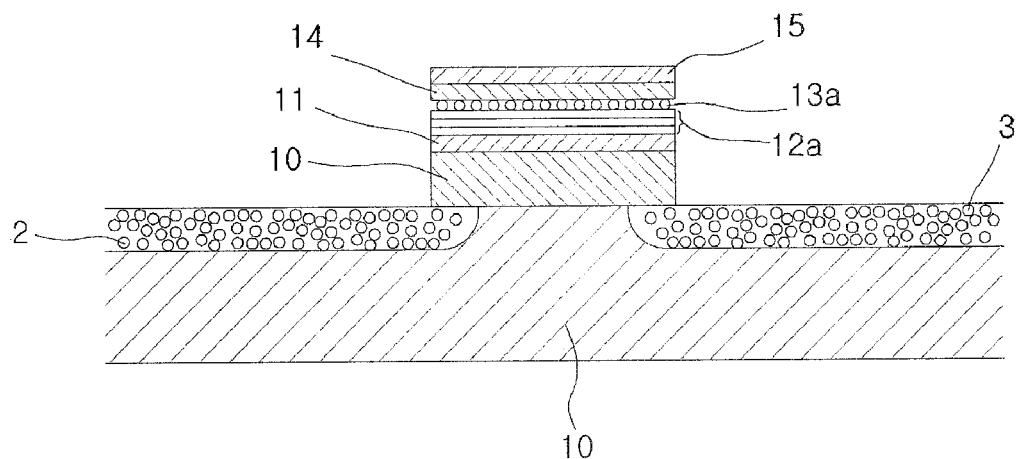

Referring to FIGS. 1 and 2F, a floating gate type non-volatile memory device according to a preferred embodiment of the present invention includes a gate structure in which a tunneling oxide film 11 formed on the upper surface of a silicon substrate 10, a floating gate 20 having multiple charge storing layers 12a, 13a; 12b, 13b;, . . . ;, and 12n, 13n, a control oxide film 14 and a control gate electrode 15 are sequentially deposited.

Also, as shown in FIG. 2F, a source region 2 and a drain region 3 in which impurities have been doped are formed in a silicon substrate 10, and a channel region is formed between the lower side of the gate structure, that is, between the source region 2 and the drain region 3.

A tunneling oxide film 11 formed on the upper surface of the substrate 10, has a structure that for example, any one or two or more among $HfO_2$, $SiO_2$, and $Al_2O_3$ of 0.9-1.9 nm thickness are deposited.

As shown in FIG. 1, the floating gate 20 formed by a self-assembly method on the upper portion of the tunneling oxide film 11 is formed of multiple charge storing layers 12a, 13a; 12b, 13b;, . . . ;, and 12n, 13n. The multiple charge storing layers 12a, 13a; 12b, 13b;, . . . ;, and 12n, 13n include polymer electrolytic films 12a-12n, having a negative charge or positive charge on the surface, respectively, and charge trap layers 13a-13n formed of a number of metal nano-crystals in which the charge trap layers 13a-13n are self-assembled on each of the polymer electrolytic films 12a-12n and charges such as an electron or hole from the substrate 10 moves and are trapped.

As shown in FIG. 2B, the polymer electrolytic films 12a-12n are formed of a multi-layer thin film of at least two layers or three layers of poly(allylamine) PAH 121 and poly(styrenesulfonate) PSS 122. The polymer electrolytic films 12a-12n are preferably formed of two or more layers to form a flat surface so that nano-crystals that are adsorbed on the upper portion thereof can be uniformly formed all over the surface thereof.

In general, the poly(allylamine) PAH 121 has a positive charge, and the poly(styrenesulfonate) PSS 122 has a negative charge. Therefore, in the case that the metal nano-crystals that are used as charge trap layers 13a-13n, for example, gold nano-crystals have a negative charge, the surface of the tunneling oxide films 11 is firstly surface-treated to have a negative charge and then PAH/PSS/PAH thin films 121-123 formed of three layers are sequentially formed in a self-assembly method. The gold nano-crystals having a negative charge are adsorbed in a self-assembly method on the PAH/PSS/PAH thin films 121-123, to thereby form first charge storing layers 12a and 13a made of a polymer electrolytic film 12a and the charge trap layer 13a of gold nano-crystals.

Poly(acrylic acid) or poly(methacrylic acid) of a carboxylic acid ($COO^-$) group may be used as the polymer electrolytic film, in addition to poly(allylamine) PAH of an amine group and poly(styrenesulfonate) PSS of a sulfonic acid ($SO_3^-$) group, and the polymer electrolytic film may be formed of a multi-layer thin film of materials having any one or more groups among the amine group, sulfonic acid ($SO_3^-$) group, and the carboxylic acid ($COO^-$) group.

Coherence that the metal nano-crystals are adsorbed to polyelectrolyte by a self-assembly method is accomplished by an electrostatic attraction force, a hydrogen bond, or a covalent bond.

In the embodiment shown in FIG. 1, the case that the PAH/PSS/PAH thin films 121-123 made of three layers are used as the polymer electrolytic film 12a to which the metal nano-crystals are adsorbed as the first charge storing layers 12a and 13a, but PAH/PSS thin films 121 and 122 made of two layers may be used as the polymer electrolytic film.

In this case, for example, gold (Au) nano-crystals are treated to have a positive charge, and thus the metal nano-crystals can be adsorbed and combined with a PSS thin film 122 having a negative charge. As a result, it is possible to form a charge storing layer made of PAH/PSS thin films 121 and 122 and gold (Au) nano-crystals having a positive charge.

By repeating the above method by one or more times, it is possible to form a floating gate 20 made of the multiple charge storing layers 12a, 13a; 12b, 13b, . . . ; and 12n, 13n in which metal nano-crystals are contained in the polyelectrolyte. In this embodiment, such a multi-layer polyelectrolyte/gold nano-crystals structure has been formed from the first to third layers, to then form a device, respectively and estimate an electrical characteristic. The result will be described later.

Any one of Co, Fe, Ni, Cr, Ag, Cu, Al, Pt, Sn, W, Ru, Pd and Cd can be used as the metal nano-crystals, in addition to Au.

In this case, size of the metal nano-crystals is in the range of between 0.1 nm-100 nm. In the case that size of the metal nano-crystals is less than 0.1 nm, it is not possible to manufacture the metal nano-crystals. In the case that size of the metal nano-crystals is more than 100 nm, the gate structure exceeds an allowable thickness.

A control oxide film 14 formed on the upper portion of the floating gate 20 has a structure that one or two or more of $HfO_2$, $SiO_2$, and $Al_2O_3$ for example, are deposited one over another in the same manner as the tunneling oxide film 11.

The control gate 15 playing a role of a gate electrode is made of a conductive film and platinum, titanium, titanium nitride, tantalum, tantalum nitride, etc., are used as usable metals of the control gate 15 for example.

In this embodiment, charge trap layers 13a-13c made of metal nano-crystals on the polymer electrolytic films 12a-12c as the first to third charge storing layers 12a-12c and 13a-13c, are sequentially formed. As a result, the case that the charge trap layer is located on the uppermost layer of the charge storing layer has been described, but a polymer electrolytic film may be located on the uppermost layer of the charge storing layer. That is, even if the control oxide film 14 is arranged on the upper portion of the polymer electrolytic film of the charge storing layer, any influence is not made on function of the charge storing layer.

As described above, the non-volatile memory device according to the present invention includes the floating gate 20 made of the multiple charge storing layers 12a, 13a; 12b, 13b;, . . . ;, and 12n, 13n formed between the tunneling oxide film 11 and the control oxide film 14, in which the respective multiple charge storing layers 12a, 13a; 12b, 13b;, . . . ;, and 12n, 13n include the polymer electrolytic films 12a-12n in which have a positive charge or a negative charge on the surface thereof, and the charge trap layers 13a-13n formed of a number of metal nano-crystals.

Therefore, since the non-volatile memory device according to this invention includes the floating gate 20 formed of the multiple charge storing layers 12a, 13a; 12b, 13b;, . . . ;, and 12n, 13n, density of the metal nano-crystals forming the charge trap layers 13a-13n increases remarkably. Accordingly, charges such as electrons or holes move from the semiconductor substrate 10 to the metal nano-crystals, to thereby increase a quantity of the trapped charges and to accordingly enhance a memory characteristic.

The nano-crystals forming the charge trap layers 13a-13n trap charges to then store the trapped charges or emit the trapped charges. That is, when programmed, charges are dispersed and injected into the nano-crystals, respectively. Here, since the nano-crystals are spaced from one another, migration of charges is limited between the nano-crystals. Therefore, even though defects occur on a portion of the tunneling oxide film 11, the leakage current by defects does not occur, since charges is trapped by the adjoining nano-crystals. Accordingly, a data retention feature can be enhanced.

Also, in the case of the non-volatile memory device according to this invention, the respective charges are stored in the charge trap layers 13a-13n, and the charge trap layers 13a-13n have a multi-layer structure. Accordingly, the number and density of the nano-crystals are greatly increased. As a result, a relatively more number of charges are trapped than that of the structure of the conventional charge trap layer having a single layer structure. Therefore, a difference between a threshold voltage when programmed and a threshold voltage when erased, can be increased. Accordingly, a programming/erasure window is increased. Poor operations of a cell transistor may be reduced.

The control oxide film 14 formed on the charge trap layers 13a-13n play a role of preventing charges stored in the charge trap layers 13a-13n from emitting to the control gate 15 formed on upper portion thereof, that is, the gate electrode, or the charges from the electrode from being injected into the charge trap layers 13a-13n, when a programming or erasure operation is not performed.

Also, the control oxide film 14 should make most of the voltage that is applied from the control gate 15 applied to the tunneling oxide film 11, at the time of programming or erasure. For this, the control oxide film 14 is preferably made of metal oxide with a high dielectric constant in comparison with silicon oxide $SiO_2$.

The metal oxide can be made of aluminum oxide $Al_2O_3$, zirconium oxide, zirconium silicate, hafnium oxide $HfO_2$, hafnium silicate etc. These may have a single form or a deposition form of two or more metal oxide materials.

In the case that the control oxide film 14 is made of silicon oxide, metal included in the metal nano-crystals is spread to the upper portion of the control oxide film 14 to thus pollute the control oxide film 14. Meanwhile, in the case that the control oxide film 14 is made of metal oxide, the metal oxide prevents metallic diffusion. Accordingly, metal included in the metal nano-crystals is hardly spread to the upper portion of the control oxide film 14. Therefore, in the case that the charge trap layers 13a-13n are made of metal nano-crystals, it is preferable that the control oxide film 14 uses the metal oxide.

The control gate 15 used as an electrode on the control oxide film 14 is made of polysilicon or metal of a work function of about 4.0 eV or more. These may have a single form or a deposition form. Titanium, titanium nitride, tantalum, tantalum nitride, etc., is used as the control gate 15, as a metallic example.

In particular, in the case that metal oxide is used as the control oxide film 14, it is preferable that the control gate 15 formed on the control oxide film 14 is made of metal whose work function of about 4.5 eV or more in order to prevent the charges from being reversely tunneled from the control gate 15 to the charge trap layers 13a-13n, when erased.

That is, the control oxide film 14 is formed of metal oxide with a high dielectric constant and the control gate 15 is made of metal whose work function of about 4.5 eV or more. Accordingly, an operating voltage can be decreased at the time of programming and erasure, and further an operating speed is also enhanced. In addition, metal can be prevented from being spread from the charge trap layers 13a-13n.

In the case of the non-volatile memory device as described above, the control oxide film 14 has an identical function to that of a dielectric film in the existing MOS (Metal-Oxide-Semiconductor) structure. The region where the charge trap layers 13a-13n made of the metal nano-crystals are not arranged on the tunneling oxide film 11 can be linked substantially with the control oxide film 14.

Therefore, the region where the charge trap layers 13a-13n are not arranged on the tunneling oxide film 11 has a MOS (Metal-Oxide-Semiconductor) structure. A region in which the metal nano-crystals are arranged has a structure of a control gate (i.e., metal gate)-a control oxide film-a (metal nano-crystal/polyelectrolyte)$_n$-a tunneling oxide film-a silicon semiconductor substrate.

Therefore, appropriate voltages are applied to the control gate 15 and the substrate in the region where the metal nano-crystals are arranged to thus make charges flow in/flow out from the metal nano-crystals to thereby program/erase data. The control oxide film 14 and the tunneling oxide film 11 maintain charges that are charged in the metal nano-crystals formed into the floating gate.

In addition, as an area that the metal nano-crystals are arranged on the tunneling oxide film 11 is wider, the non-volatile memory device, that is, the characteristic of the flash memory device can be improved. Accordingly, it is desirable that density that the metal nano-crystals are arranged on the tunneling oxide film 11 is greatly formed at maximum.

As methods of increasing density of the metal nano-crystals, there are a method of increasing an adsorption rate of the metal nano-crystals for the tunneling oxide film 11 to be described later, a method of forming charge trap layers 13a-13n made of metal nano-crystals into a multilayer structure as shown in FIG. 1, and a method of forming a gate structure, for example, into a three-dimensional structure as is illustrated in the Korean Patent No. 745400, to thereby increase surface areas of the charge trap layers 13a-13n.

Hereinbelow, a method of manufacturing a non-volatile memory device according to a preferred embodiment of the present invention, with reference to FIGS. 2A through 2F.

Referring to FIG. 2A, a tunneling oxide film 11 of 0.9-1.9 nm thickness is formed on a substrate 10 made of mono-crystal silicon. The tunneling oxide film 11 may be formed of silicon oxide ($SiO_2$), or one metal oxide among aluminum oxide ($Al_2O_3$), zirconium oxide, zirconium silicate, hafnium oxide ($HfO_2$), and hafnium silicate.

Meanwhile, the tunneling oxide film 11 may be formed of at least one selected from the group consisting of silicon oxide ($SiO_2$), aluminum oxide ($Al_2O_3$), zirconium oxide, zirconium silicate, hafnium oxide ($HfO_2$), and hafnium silicate.

In the case that the silicon oxide ($SiO_2$) is used for the tunneling oxide film 11, the silicon oxide ($SiO_2$) is formed through a thermal oxidation process. In the case that the silicon oxide ($SiO_2$) is used for the tunneling oxide film 11, the silicon oxide ($SiO_2$) is formed into the tunneling oxide film 11, through a thermal oxidation process.

Thereafter, as shown in FIGS. 2B and 2C, a preprocess is executed in order to form a polymer electrolytic film 12a and a charge trap layer 13a formed of a number of metal nano-crystals, in turn on the tunneling oxide film 11. Then, the polymer electrolytic film 12a is attached on the tunneling oxide film 11 using a self-assembly method.

That is, the silicon substrate 10 on which the tunneling oxide film 11 has been formed is dipped into a mixed solution in which water, hydrogen peroxide, and ammonia water are mixed at the ratio of 5:1:1, and then heated to execute the preprocess so that surface of the tunneling oxide film 11 has negative charges. For example, in the case that the tunneling oxide film 11 is formed of $HfO_2$, and then the preprocess has been executed, the outermost surface of the tunneling oxide film 11 becomes $HfO_2^-$, that is, has negative charges.

Then, the silicon substrate 10 on which the tunneling oxide film 11 has been formed is sequentially dipped into a PAH solution having positive charges, a PSS solution having negative charges and a PAH solution having positive charges for ten minutes, respectively. Thereafter, the silicon substrate 10 on which the tunneling oxide film 11 has been formed is taken out and washed to then be dried using nitrogen gas. Accordingly, a PAH thin film 121, a PSS thin film 122 and a PAH thin film 123 are sequentially deposited on the tunneling oxide film 11, to thereby form the polymer electrolytic film 12a of three layers. In this case, the PAH thin films 121 and 123 and the PSS thin film 122 are about 1.2 nm and 1.3 nm thickness, respectively.

Concentration of PAH and PSS solutions (products of Aldrich company in the U.S.A.) used to form the PAH (molecular weight Mw=70,000) and PSS (Mw=70,000) thin films is 1 mg·mL$^{-1}$. Each solution includes 0.5M NaCl in order to set concentration of the polymer electrolytic film to be a desired concentration.

In the above-described embodiment, the polymer electrolytic film 12a made of the PAH/PSS/PAH thin films on the tunneling oxide film 11 is formed using a self-assembly method of dipping the silicon substrate 10 into the PAH solution and the PSS solution and synthesizing the PAH/PSS/PAH thin films at a liquid phase. However, it is possible to uniformly coat the solutions on the tunneling oxide film 11 using a spin coating method.

Then, as shown in FIG. 2C, the charge trap layer 13a formed of a number of metal nano-crystals is formed on the upper surface of the polymer electrolytic film 12a. A case that gold (Au) nano-crystals are applied as the metal nano-crystals forming the charge trap layer 13a will be described below as an example.

First, an aqueous solution in which gold nano-crystals having negative charges are dispersed can be synthesized using a Citrate reduction method. The aqueous solution in which gold nano-crystals having negative charges are dispersed, can be obtained by stirring 2 mM tetrachloride gold acid (HAuCl$_4$) of 259 mL at 70° C., mixing 68 mM sodium citrate of 25 mL in the 2 mM tetrachloride gold acid (HAuCl$_4$) of 259 mL during stirring, and heating the mixed result for ten minutes at 70° C. Particle diameters of the produced gold nano-crystals are about 16±2 nm (standard deviation of 100 particles).

Figure 3:
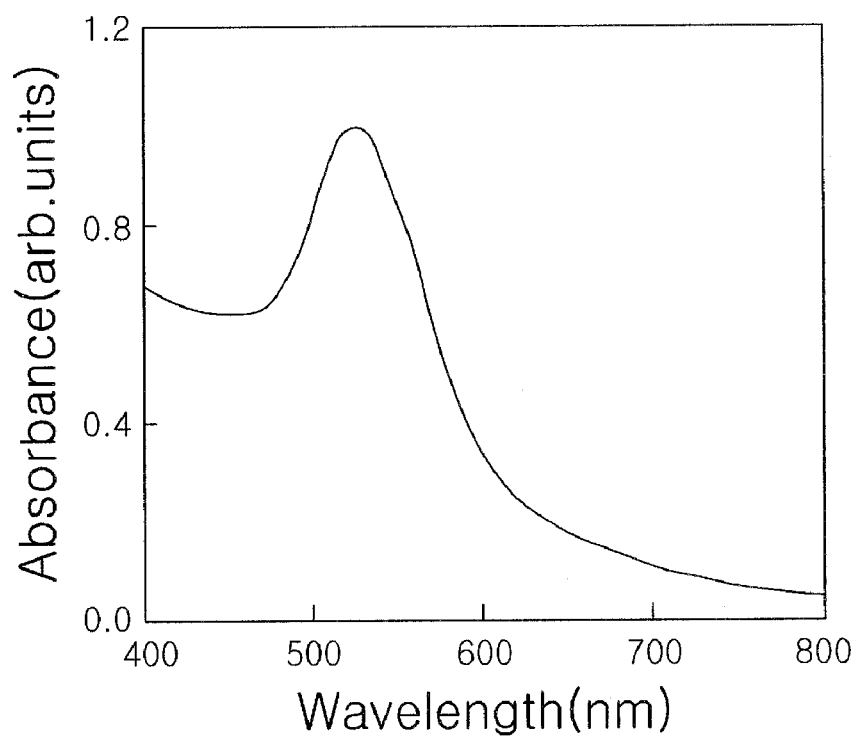
FIG. 3 is a graphical view illustrating a UV-vis spectrum of gold (Au) nano-crystals that are dispersed in an aqueous solution.

FIG. 3 is a graphical view illustrating a UV-vis spectrum of gold (Au) nano-crystals that are dispersed in an aqueous solution, in which a sample of the aqueous solution is measured using a UV-vis spectrophotometer. Here, it can be seen that gold nano-crystallization is well performed since a plasmon absorption peak appears at the wavelength of 525 nm in the case of the gold nano-crystal particles dispersed in the aqueous solution of pH 5.6.

Then, the substrate 10 on which the polymer electrolytic film 12a made of the PAH/PSS/PAH thin films has been formed is dipped into the aqueous solution where the gold nano-crystal particles have been dispersed for sixty minutes. In this case, the gold nano-crystals having negative charges form a surface layer of the polymer electrolytic film 12a and is adsorbed onto the surface of the PAH thin film 122 having positive charges by a strong covalent bond.

The reaction equation which represents a creation of gold particles by reaction of the tetrachloride gold acid (HAuCl$_4$) and sodium citrate is disclosed in a paper by Grabar, K. C., Freeman, R. G., Hommer, M. B., Natan, M. J. "Preparation and Characterization of Au Colloid Monolayers. Anal. Chem. 67, -743 1995."

Coherence necessary when the metal nano-crystals is adsorbed to polyelectrolyte by a self-assembly method is accomplished by an electrostatic attraction force or a hydrogen bond in addition to the covalent bond.

The coherence according to the electrostatic attraction force is accomplished between an acid-doped, positively charged polyaniline backbone and a negatively charged polyanion. The coherence between partially doped polyanilin and polyanion (for example, PSS (poly styrenesulfonic acid), polyamic acid, poly(methacrylic acid)) is accomplished by the electrostatic attraction force (see a paper of J. H. Cheung, W. B. Stockton, and M. F. Rubner, "Molecular-Level Processing of Conjugated Polymers. 3. Layer-by-Layer Manipulation of Polyaniline via Electrostatic Interactions," Macromolecules 1997, 30, 2712-2716.").

The hydrogen bond is accomplished between for example, nonionic water soluble hydrogen-bonding polymers having respective functional groups which are hydrogen-bonded with polyaniline. The coherence between polyaniline and the nonionic water soluble hydrogen-bonding polymers (for example, poly(vinylpyrrolidone), poly(ethylene oxide), poly (acrylamide), and poly(vinyl alcohol)) is accomplished by the hydrogen bond (see a paper by W. B. Stockton and M. F. Rubner, "Molecular-Level Processing of Conjugated Polymers. 4. Layer-by-Layer Manipulation of Polyaniline via Hydrogen-Bonding Interactions," Macromolecules 1997, 30, 2717-2725).

In the above-described embodiment, the metal nano-crystals formed on the polymer electrolytic film 12a are formed using a dip coating method of dipping the silicon substrate 10 on which the polymer electrolytic film 12a has been formed in an aqueous solution (that is, a citrate reduction solution). However, it is possible to coat the solutions on the polymer electrolytic film 12a, using a spin coating method, a spray coating method, a flow coating method, or a screen printing method.

In FIG. 2C, only the first charge storing layers including the polymer electrolytic film 12a and the charge trap layer 13a made of a number of the metal nano-crystals are illustrated as an example. However, as shown in FIG. 1, multiple charge storing layers 12a, 13a; 12b, 13b;, . . . ;, and 12n, 13n can be formed by repeatedly performing a process of forming the first charge storing layers including the polymer electrolytic film 12a and the charge trap layer 13a.

The multiple charge storing layers 12a, 13a; 12b, 13b;, . . . ,, and 12n, 13n which are produced as described above are dried for two hours at 100° C. under vacuum.

Figure 4:
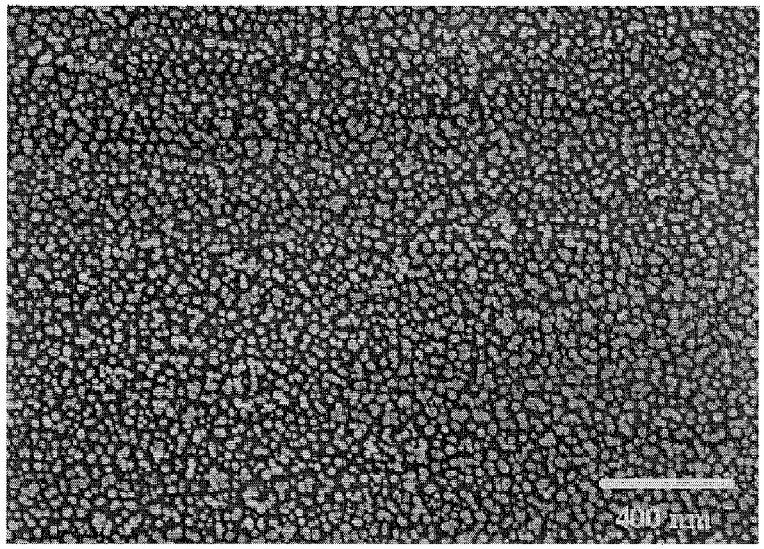
FIG. 4 is a pictorial view of an electron microscopical picture showing the surface state of the gold nano-crystals formed on the surface of the substrate at the state where the process of FIG. 2C is completed.

FIG. 4 is a pictorial view of an electron microscopical picture showing the surface state of the gold nano-crystals formed on the surface of the substrate at the state where the process of FIG. 2C is completed. In FIG. 4, it can be seen that gold nano-crystals have been adsorbed on the polymer electrolytic film 12a of three layers formed of the PAH/PSS/PAH thin films.

Meanwhile, in this invention, it is possible to use an even number of layers of two layers or more as the polymer electrolytic film. In this case, positively charged gold nano-crystal particles which can be bonded on the surface of the negatively charged PSS thin film are needed. The positively charged gold nano-crystal particles are formed by mixing a stabilizer simultaneously having —SH group and —$NH_3^+$ such as mercaptoethylamine into a gold nano-crystal particle solution having a sodium citrate stabilizer, to then create a strong covalent bond between the —SH group and the gold nano-crystal particles, and to thus make the sodium citrate stabilizer fall away and mercaptoethylamine adhered.

Therefore, it is possible to use a polymer electrolytic film having an even number of layers of the PAH/PSS thin films using positively charged gold nano-crystals.

Thereafter, as shown in FIG. 2D, a control oxide film 14 is formed the substrate on which the first charge storing layers including the polymer electrolytic film 12a and the charge trap layer 13a or a number of charge storing layers have been formed in the same manner as that of the tunneling oxide film 11. The control oxide film 14 may be formed by evaporating silicon oxide $SiO_2$ or metal oxide having a high dielectric rate in comparison with the silicon oxide.

The metal oxide includes hafnium oxide, aluminum oxide, zirconium oxide, zirconium silicate, hafnium silicate etc. The metal oxide may be formed to have a single layer or two layers or more. The metal oxide may be formed by a chemical vapor deposition method or an atom layer deposition method. Preferably, $HfO_2$ may be evaporated to about 15 nm thickness by a RF-magnetron sputtering method so as to be used as the control oxide film 14.

In the case that the control oxide film 14 is formed of metal oxide, the control oxide film 14 plays a role of a barrier layer that prevents metallic diffusion. Therefore, in the case that the charge trap layers 13a-13n are formed of metal nano-crystals, it is preferable to form the control oxide film 14 using metal oxide in order to prevent the metal atoms included in the metal nano-crystals from being diffused to the upper portions of the charge trap layers 13a-13n.

Referring to FIG. 2E, a conductive film 15a is formed on the control oxide film 14. The conductive film may be formed of polysilicon in the form of a single layer or a multi-layer, or metal whose work function is about 4.0 eV or higher. Platinum (Pt), titanium (Ti), titanium nitride (TiN), tantalum (Ta), tantalum nitride (TaN) etc., may be used as metal in order to the conductive film 15a. In particular, in the case that metal oxide is used as the control oxide film 14, it is preferable that the conductive film is formed of metal whose work function is about 4.5 eV or higher. Thereafter, the conductive film 15a is patterned to form a control gate 15.

When the control oxide film 14 is formed using metal oxide, it is not easy to etch the metal oxide through a dry type etching process. As a result, although the control oxide film 14, the charge trap layer 13a and the polymer electrolytic film 12a are not patterned in the lower portion of the control gate 15, charges are trapped only in the charge trap layer 13a which is located below the control gate 15. Accordingly, cell operations of the non-volatile memory device are not greatly influenced.

In addition, in this invention, after platinum of 100 nm thickness has been evaporated on the control oxide film 14 as the control gate 15 at the normal temperature by the DC magnetron sputtering method, it is possible to form the control gate 15, that is, a gate electrode by forming patterns using a lift-off process.

Meanwhile, in the case that the control oxide film 14 is formed using silicon oxide, the control oxide film 14, the charge trap layer 13a, and the polymer electrolytic film 12a are sequentially etched and patterned as shown in FIG. 2F.

In the case of the method of manufacturing the non-volatile memory device, as shown in FIG. 1, the polymer electrolytic films 12a-12n formed of a multi-layer and the charge trap layers 13a-13n formed of a number of metal nano-crystals are attached with each other by a self-assembly method, in order to form a floating gate 20 formed of multiple charge storing layers 12a, 13a; 12b, 13b;, . . . ;, and 12n, 13n on the tunneling oxide film 11. Then, a drying process is undergone at 100° C. which does not influence upon the characteristic of a film quality.

Therefore, the method of manufacturing the non-volatile memory device according to the present invention does not employ a high temperature thermal treatment process of forming the nano-crystals on a silicon substrate as in the conventional case. A negative impact on the component features depending upon the characteristic of the film quality which has occurred according to the high temperature heat treatment process can be prevented.

Hereinbelow, a sample of the non-volatile memory device according to the present invention will be manufactured and described in view of the characteristics.

Embodiment

A. Preparation of a Substrate

A specimen is manufactured on a p-type silicon substrate (to (100) direction and 1-10 ohm-cm that is made in Siltron company). In the preprocess, the p-type silicon substrate is cleaned using a mixture solution containing sulfonic acid and the hydrogen peroxide at a mixture ratio of 7:3, and then a nature oxide film is removed using a hydrofluoric acid (HF) and washed using ultrapure water.

B. Formation of a Tunneling Oxide Film $HfO_2$ of 0.9-1.9 nm thickness is evaporated as a tunneling oxide film using a RF-magnetron sputtering device. $HfO_2$ evaporation is progressed using a Hf target by a reactive ion sputtering method at an argon and oxygen atmosphere. A base pressure is $10^{-6}$ Torr or below, and a process pressure is kept as 20 mTorr.

C. Formation of Charge Storing Layers

The charge storing layers $(PEs/Au_{NP})n$ (here, PEs means polyelectrolyte of PAH/PSS/PAH three layers) are formed on the silicon substrate on which $HfO_2$ is coated, in 1, 2, 3 or 4 layers, respectively.

(1) Composition of Negatively Charged Gold Nano-crystal Particles

The negatively charged gold nano-crystal particles are synthesized using a citrate reduction method. The citrate reduction solution for synthesizing gold nano-crystal particles can be obtained by stirring 2 mM tetrachloride gold acid ($HAuCl_4$) of 259 mL at 70° C., mixing 68 mM sodium citrate of 25 mL in the 2 mM tetrachloride gold acid ($HAuCl_4$) of 259 mL during stirring, and heating the mixed result for ten minutes at 70° C. Particle diameters of the produced gold nano-crystals are about 16±2 nm (standard deviation of 100 particles). As shown in FIG. 4, plasmon absorption peak appears at the wavelength of 525 nm in the case of the gold nano-crystal particles dispersed in the aqueous solution of pH 5.6 (that is, the citrate reduction solution).

(2) Preprocess of the Substrate

The silicon substrate on which $HfO_2$ is evaporated is heated in a mixed solution in which water, hydrogen peroxide, and ammonia water are mixed at the ratio of 5:1:1, for five seconds at 65° C., to then make surface of the silicon substrate negatively charged.

(3) Formation of $(PEs/Au_{NP})_n$

PSS (Mw=70,000) that has negative charges and PAH (Mw=70,000) that has positive charges are purchased from Aldeuri company in the U.S.A. The concentration of PAH and PSS solutions used in the experiment is 1 mg·$mL^{-1}$. The polymer electrolyte layer is formed by dipping for ten minutes in the PAH solution (including 0.5M NaCl) that has positive charges and the PSS solution (including 0.5M NaCl) that has negative charges. Then, the polymer electrolyte layer is washed using ultrapure water for one minute and dried using nitrogen gas. The gold nano-crystal particles which are negatively charged are dipped in the citrate reduction solution for sixty minutes and formed on the polymer electrolytic films PAH/PSS/PAH. (PEs/Au$_{NP}$)n of a multilayer structure has been formed by repeatedly performing the above-described process. The synthesized multilayer film is dried for two hours at 100° C. under vacuum.

D. Formation of a Control Oxide Film/a Gate Electrode

Thereafter, 15 nm HfO$_2$ (blocking oxide layer) is evaporated as the control oxide film in the same manner as that of the tunneling oxide film. Then, platinum of 100 nm thick is evaporated as the gate electrode (control gate) at the normal temperature by the DC magnetron sputtering method. The base pressure is $10^{-6}$ Torr or below and the process pressure is kept at 3 mTorr. The gate electrode is patterned in an area of $4.70 \times 10^{-5}$ cm$^2$ using a lift-off process. A copper plate is attached using a silver paint on the rear side of the substrate for ground connection.

In this embodiment, polyelectrolyte is formed in a multi-layer thin film, and gold nano-crystals are adsorbed on the PAH/PSS/PAH multi-layer thin films, to thus form multi-layered thin films of polyelectrolyte and gold nano-crystals. In this embodiment, the multi-layer polyelectrolyte/gold nano-crystals structure is formed from first to third layers, respectively. Each device is formed to then estimate electrical characteristics thereof.

Figure 5:
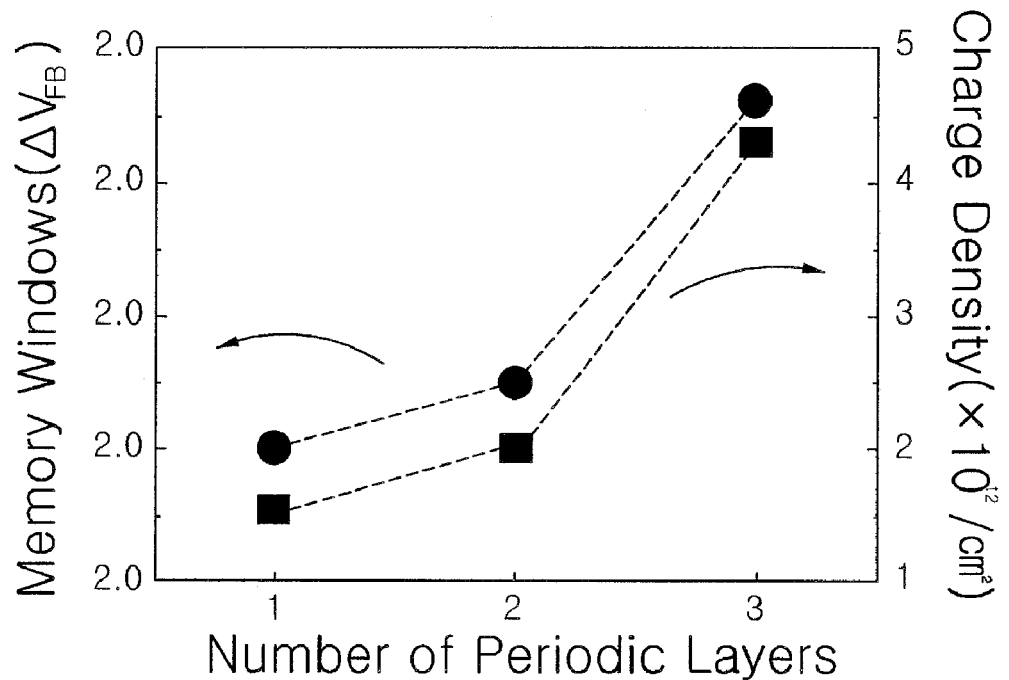
FIG. 5 is a graphical view illustrating change of a memory characteristic when a charge storing layer made of polyelectrolyte/gold nano-crystals is changed to a first layer to a third layer in a floating gate.

FIG. 5 is a graphical view illustrating change of a memory characteristic when a charge storing layer made of polyelectrolyte/gold nano-crystals is changed to a first layer to a third layer in a floating gate.

As shown in FIG. 5, in the case that a gold nano-crystal of one layer is used as a charge storing layer, a memory window is 0.5V. In contrast, in the case that gold nano-crystals of three layers are used as charge storing layers, the memory window is 1.8V, to thereby confirm that a memory characteristic is enhanced 3.6 times. In addition, it can be seen that a charge density is increased together with a memory window according to an increase of the deposition layers of gold nano-crystals in both two specimens (• and ■).

This memory characteristic enhancement may be analyzed in the following pint of view. That is, since the charge storing layer is formed of a multi-layer, the charge density of the gold nano-crystals increases remarkably, and thus charges such as electrons or holes move to the gold nano-crystals to thereby cause a quantity of trapped charges to be increased. It can be confirmed that this analysis accords with the result of calculating the number of trapped electrons.

Figure 6:
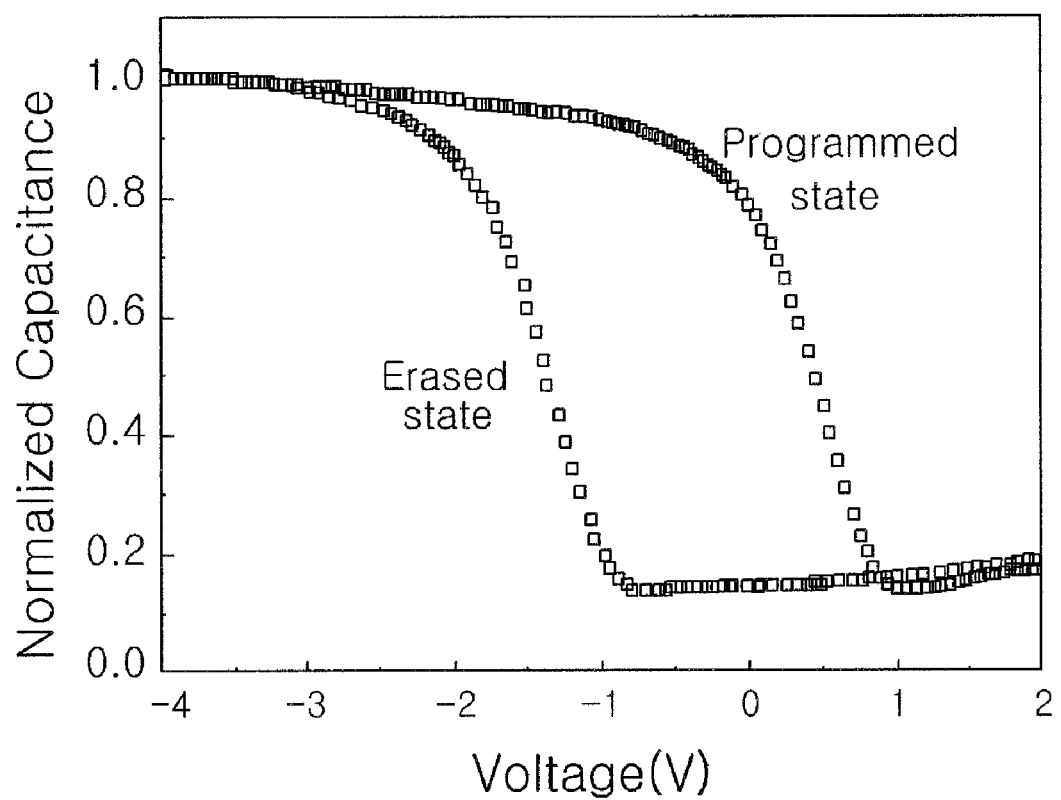
FIG. 6 is a graphical view illustrating a relationship between applied voltage and capacitance to confirm a memory effect of the non-volatile memory device according to the present invention.

FIG. 6 is a graphical view illustrating a relationship between voltage and capacitance that are applied to confirm a memory effect of the non-volatile memory device according to the present invention.

A voltage is applied between the gate electrode and the substrate as shown in FIG. 1 for estimation of electrical characteristics to thus measure a capacitance value. A voltage of 20V is applied to the gate electrode for program for 30 msec, and a voltage of −8V is applied to the gate electrode for erasure for 10 msec. The Programmed state and the erased state are confirmed through change in the respective capacitance curves.

In addition, it can be seen that a flat-band voltage which is erased and measured at −8V for 10 ms differs by 1.49V from a flat-band voltage which is programmed and measured at 20V for 30 ms.

Therefore, metal nano-crystals are formed into a multi-layered charge trap layer using multiple polymer electrolytic films, to thus use a floating gate constituting multiple electron storing layers. Accordingly, it can be seen that a data program/data erasure can be divided. As a result, a device in which metal nano-crystals of a multilayer structure are manufactured as a floating gate represents characteristics of the non-volatile memory device.

Figure 7:
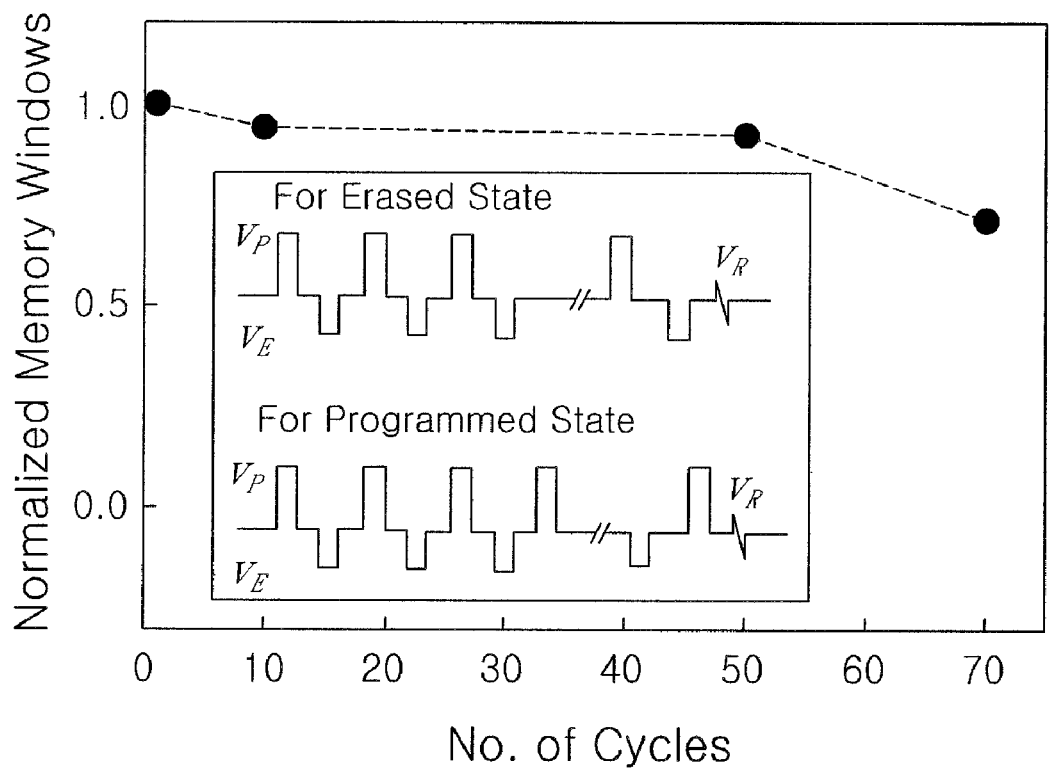
FIG. 7 is a graphical view illustrating a relationship between the number of times of recording/erasure and a memory effect for testing durability of the non-volatile memory device according to the present invention.

FIG. 7 is a graphical view illustrating a relationship between the number of times of recording/erasure and a memory effect for testing durability of the non-volatile memory device according to the present invention. In FIG. 7, even though several tens of times of programming/erasure operations are repeated for the device formed according to the embodiment, it can be seen that a big change does not exist in the memory effect.

Figure 8:
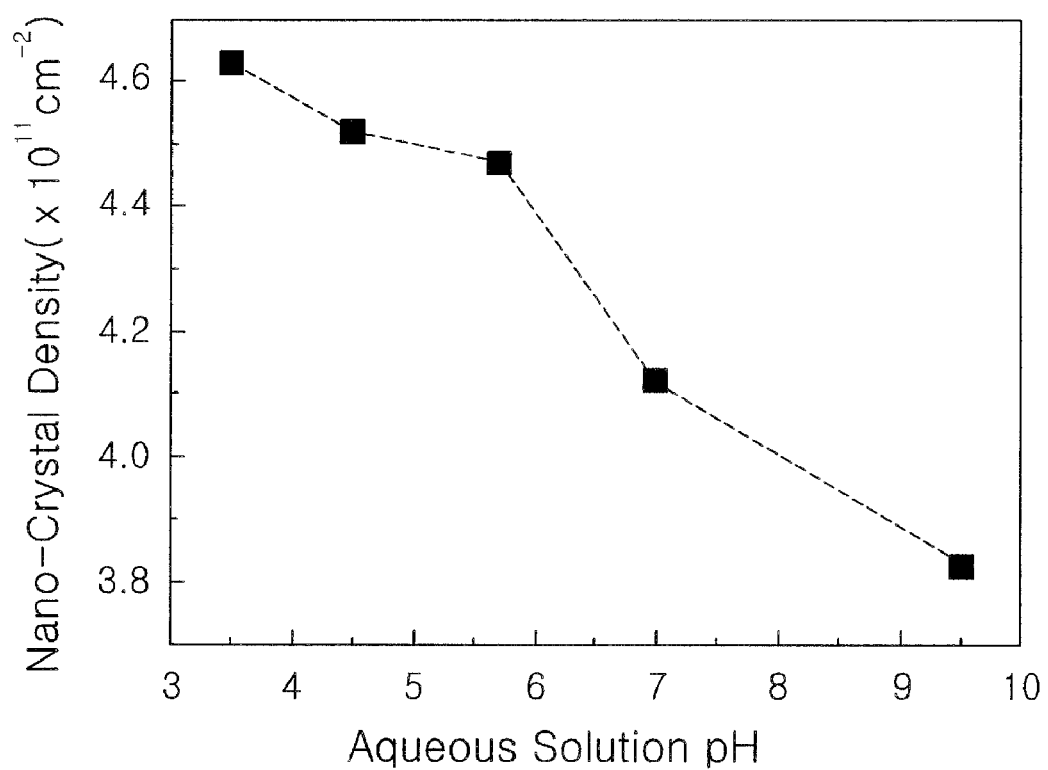
FIG. 8 is a graphical view illustrating change in density of the gold (Au) nano-crystals according to change of hydrogen ion concentration index (pH) in an aqueous solution in which gold nano-particles are dispersed.

FIG. 8 is a graphical view illustrating change in density of the gold (Au) nano-crystals according to change of hydrogen ion concentration index (pH) in an aqueous solution in which gold nano-particles are dispersed.

In the result of investigating a change in density of the gold (Au) nano-crystals (crystallization) according to a change in hydrogen ion concentration index (pH) in an aqueous solution in which gold nano-particles are dispersed, it can be seen that a density and a quantity of adsorption of the gold (Au) nano-crystals are increased according to a decrease of the pH value as illustrated in FIG. 8. It is preferable that the hydrogen ion concentration index (pH) of the solution is set in the range of 3 to 10 so that the density of the adsorbed gold (Au) nano-crystals become high. In the case that the hydrogen ion concentration index (pH) of the solution is less than 3, aggregation between the nano-crystals becomes large, and thus it is difficult to separate the respective particles. In the case that the hydrogen ion concentration index (pH) of the solution exceeds 10, the density of the nano-crystals is low, and thus it is difficult to employ the solution. Therefore, the hydrogen ion concentration index (pH) of the solution is changed, to thus control an adsorption amount of the gold (Au) nano-crystals.

As described above, the present invention provides a floating gate having multiple charge storing layers, a method of fabricating the floating gate, a non-volatile memory device using the same, and a method of fabricating the non-volatile memory device, in which a positive charge and a negative charge are artificially controlled using polyelectrolyte that is charged, to thus laminate the polyelectrolyte and metal nano-crystals in a multi-layer in order to form a floating gate and to thus improve a charge storage capacity of the non-volatile memory device.

In addition, the present invention provides a non-volatile memory device using a floating gate and a method of fabricating the non-volatile memory device, in which the floating gate is formed using metal nano-crystals of nano-size, in which density of the metal nano-crystals forming the floating gate can be easily controlled, and the metal nano-crystals can be self-assembled or absorbed with polyelectrolyte without undergoing a high temperature heat treatment process which may cause a problem such as a film quality characteristic change of the floating gate to thus form a floating gate. Accordingly, a leakage phenomenon of the trapped charges according to defects of the tunneling oxide film can be reduced.

Further, the present invention provides a non-volatile memory device and a method thereof, having an improved information storage capacity and memory characteristic, that is, a memory hysteresis characteristic in which multi-layer metal nano-crystals are used as a charge storing layer to thus remarkably increase density of the nano-crystals.

Further, the non-volatile memory device according to the present invention uses the metal nano-crystals as a charge trap site. Accordingly, in comparison with a non-volatile integrated circuit device which uses the conventional floating gate, a leakage phenomenon of the trapped charges through the defects can be remarkably reduced.

As described above, the present invention can deposit metal nano-crystals by a self-assembly method or an absorption method without using a high temperature thermal treatment process, and thus can be applied to a floating gate forming multiple charge storing layer, a non-volatile memory device using the floating gate, or a floating electrode of a thin film transistor-liquid crystal display device (TFT-LCD).

As described above, the present invention has been described with respect to a particularly preferred embodiment. However, the present invention is not limited to the above embodiment, and it is possible for one who has an ordinary skill in the art to make various modifications and variations, without departing off the spirit of the present invention.

What is claimed is:

1. A method of manufacturing a floating gate, the floating gate manufacturing method comprising the steps of:
    forming a tunneling oxide film on a substrate;
    forming a polymer electrolytic film on the tunneling oxide film;
    forming a nano-particle layer in which a number of the nano-particles are formed on the polymer electrolytic film; and
    repeatedly forming the polymer electrolytic film and the metal nano-particles by at least one time;
    wherein the step of forming the nano-particles on the polymer electrolytic film comprises:
    preparing a solution in which a number of nano-particles having a charge polarity reverse to that of the polymer electrolytic film are dispersed; and
    dipping the substrate in which the polymer electrolytic film is formed into the solution or spin coating to self-assemble the number of nano-particles on the polymer electrolytic film.

2. The floating gate manufacturing method of claim 1, further comprising the step of surface-treating the surface of the tunneling oxide film to have a negative charge before having formed the polymer electrolytic film,
    wherein the step of forming the polymer electrolytic film comprises:
    a first step of forming a first electrolytic film having a positive charge on the upper portion of the tunneling oxide film having a negative charge using a self-assembly method;
    a second step of forming a second electrolytic film having a negative charge on the first electrolytic film using a self-assembly method; and
    repeating the first and second steps by at least one time.

3. The floating gate manufacturing method of claim 1, wherein the polymer electrolytic film is formed of a thin film made of at least one selected from the group consisting of an amine group, a sulfonic acid ($SO_3^-$) group and a carboxylic acid ($COO^-$) group, or a multi-layer thin film made by alternatively laminating at least two selected from the group consisting of an amine group, a sulfonic acid ($SO_3^-$) group and a carboxylic acid ($COO^-$) group.

4. The floating gate manufacturing method of claim 1, wherein the polymer electrolytic film is made of poly(allylamine), poly(styrenesulfonate), and poly(allylamine), and is formed by adsorption in a solution or spin coating.

5. The floating gate manufacturing method of claim 1, wherein density of the nano-particles which are self-assembled on the polymer electrolytic film is adjusted by a hydrogen ion concentration index (pH) of the solution.

6. The floating gate manufacturing method of claim 1, wherein the nano-particles are made of any one selected from the group consisting of Co, Fe, Ni, Cr, Au, Ag, Cu, Al, Pt, Sn, W, Ru, Pd, Cd, Si, and Ge.

7. The floating gate manufacturing method of claim 6, wherein the nano-particles have a size between 0.1 or 100 nm, respectively.

8. The floating gate manufacturing method of claim 1, wherein the nano-particles are combined with the polymer electrolytic film using any one among an electrostatic attraction force, a hydrogen bond and a covalent bond.

9. A method of manufacturing a non-volatile memory device, the method comprising the steps of:
    forming a tunneling oxide film on a substrate;
    forming a polymer electrolytic film on the tunneling oxide film;
    forming a charge trap layer made of a number of the nano-particles on the polymer electrolytic film;
    forming a control oxide film on the charge trap layer;
    forming a control gate on the control oxide film; and
    surface-treating the surface of the tunneling oxide film to have a charge polarity reverse to that of the polymer electrolytic film before having formed the polymer electrolytic film, and wherein the polymer electrolytic film is formed on the upper portion of the tunneling oxide film by a self-assembly method.

10. The non-volatile memory device manufacturing method of claim 9, wherein the step of forming a polymer electrolytic film and the step of forming a charge trap layer are executed by at least one time.

11. The non-volatile memory device manufacturing method of claim 9, wherein the step of forming the polymer electrolytic film is executed by laminating a first electrolytic film having a positive charge and a second electrolytic film having a negative charge alternately in a multi-stage, on the upper portion of the tunneling oxide film having the negative charge.

* * * * *